US012804799B2

(12) United States Patent
Yao et al.

(10) Patent No.: US 12,804,799 B2
(45) Date of Patent: Nov. 17, 2026

(54) MOLDED ELECTRONIC ASSEMBLY

(71) Applicant: Industrial Technology Research Institute, Hsinchu (TW)

(72) Inventors: Li-Wei Yao, Hsinchu County (TW); Hsiao-Fen Wei, New Taipei City (TW); Chung-Wei Wang, New Taipei City (TW); Shu-Wei Kuo, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 440 days.

(21) Appl. No.: 18/506,151

(22) Filed: Nov. 10, 2023

(65) Prior Publication Data

US 2024/0164008 A1 May 16, 2024

Related U.S. Application Data

(60) Provisional application No. 63/424,490, filed on Nov. 11, 2022.

(30) Foreign Application Priority Data

Oct. 31, 2023 (TW) ................................ 112141687

(51) Int. Cl.
*H05K 1/02* (2006.01)
*H05K 1/181* (2026.01)
(Continued)

(52) U.S. Cl.
CPC ........... *H05K 1/0209* (2013.01); *H05K 1/181* (2013.01); *H10H 20/852* (2025.01);
(Continued)

(58) Field of Classification Search
CPC .. H05K 1/0209; H05K 1/0256; H05K 1/0271; H05K 1/0281; H05K 1/0284;
(Continued)

(56) References Cited

U.S. PATENT DOCUMENTS

| | | | | |
|---|---|---|---|---|
| 5,737,191 A * | 4/1998 | Horiuchi | ............... | H10W 40/22 174/541 |
| 5,857,767 A * | 1/1999 | Hochstein | ............... | F21S 45/48 362/547 |

(Continued)

FOREIGN PATENT DOCUMENTS

| | | |
|---|---|---|
| CN | 104853896 | 6/2018 |
| CN | 214172181 | 9/2021 |

(Continued)

OTHER PUBLICATIONS

Srinivasan Palanisamy et al., "In-depth scrutinization of In-Mold Electronics for Automotive applications", Journal of Physics Conference Series, Jul. 2021, pp. 1-12.

(Continued)

*Primary Examiner* — Amir A Jalali
(74) *Attorney, Agent, or Firm* — JCIPRNET

(57) ABSTRACT

A molded electronic assembly including a circuit substrate, a plurality of electronic devices, and at least one patterned heat dissipation structure is provided. The circuit substrate includes a substrate and a circuit, where the substrate has a top surface, and the circuit has a plurality of signal contacts distributed on the top surface. The electronic devices are disposed on the circuit substrate, and each of the electronic devices has a plurality of device pins connected to the signal contacts. The at least one patterned heat dissipation structure corresponds to a signal contact of the signal contacts and starts from the corresponding signal contact and extends toward a plurality of directions on the top surface of the substrate.

20 Claims, 18 Drawing Sheets

(51) Int. Cl.

| | |
|---|---|
| ***H10H 20/852*** | (2025.01) |
| ***H10H 20/857*** | (2025.01) |
| ***H10H 20/858*** | (2025.01) |
| ***H10W 40/22*** | (2026.01) |
| ***H10W 72/00*** | (2026.01) |
| ***H10W 72/20*** | (2026.01) |
| ***H10W 72/90*** | (2026.01) |
| ***H10W 90/00*** | (2026.01) |

(52) U.S. Cl.
CPC .... *H10H 20/8582* (2025.01); *H10H 20/8583* (2025.01); *H10W 40/22* (2026.01); *H10W 90/00* (2026.01); *H05K 2201/10015* (2013.01); *H05K 2201/10022* (2013.01); *H05K 2201/1003* (2013.01); *H05K 2201/10037* (2013.01); *H05K 2201/10053* (2013.01); *H05K 2201/10106* (2013.01); *H05K 2201/10151* (2013.01); *H05K 2201/10166* (2013.01); *H05K 2201/10174* (2013.01); *H05K 2201/10189* (2013.01); *H10H 20/857* (2025.01); *H10W 72/07253* (2026.01); *H10W 72/232* (2026.01); *H10W 72/932* (2026.01); *H10W 90/724* (2026.01)

(58) Field of Classification Search
CPC ...... H05K 1/0296; H05K 1/117; H05K 1/141; H05K 1/181; H05K 2201/10015; H05K 2201/10022; H05K 2201/1003; H05K 2201/10037; H05K 2201/10053; H05K 2201/10106; H05K 2201/10151; H05K 2201/10166; H05K 2201/10174; H05K 2201/10189; H10H 20/852; H10H 20/857; H10H 20/8583; H10W 40/22; H10W 72/07253; H10W 72/232; H10W 72/932; H10W 90/00; H10W 90/724
See application file for complete search history.

(56) References Cited

U.S. PATENT DOCUMENTS

| | | | | |
|---|---|---|---|---|
| 5,953,214 | A * | 9/1999 | Dranchak | H01R 12/714 361/767 |
| 10,091,887 | B2 | 10/2018 | Heikkinen et al. | |
| 10,575,407 | B2 | 2/2020 | Heikkinen et al. | |
| 11,530,808 | B1 | 12/2022 | Bräysy et al. | |
| 12,245,358 | B2 * | 3/2025 | Wang | H05K 1/0203 |
| 2003/0036220 | A1 * | 2/2003 | Ikegami | H05K 3/4007 257/E23.068 |
| 2005/0051358 | A1 * | 3/2005 | Kawamoto | H05K 3/284 361/818 |
| 2005/0140023 | A1 * | 6/2005 | Kinoshita | H10W 74/012 257/E21.511 |
| 2006/0131065 | A1 | 6/2006 | Ohwaki | |
| 2006/0202312 | A1 * | 9/2006 | Iijima | H01Q 1/2283 257/664 |
| 2008/0101045 | A1 * | 5/2008 | Jung | H05K 3/205 29/831 |
| 2008/0296752 | A1 * | 12/2008 | Nakajima | H10W 90/401 257/E23.024 |
| 2010/0148362 | A1 * | 6/2010 | Sakurai | H10W 90/701 257/737 |
| 2010/0244212 | A1 * | 9/2010 | Ha | H10W 90/401 257/676 |
| 2010/0328638 | A1 * | 12/2010 | Ishida | G03F 7/7005 257/E33.056 |
| 2011/0068467 | A1 * | 3/2011 | Ozaki | H10W 74/012 257/737 |
| 2014/0070396 | A1 * | 3/2014 | Kyozuka | H10W 70/09 257/698 |
| 2014/0124941 | A1 * | 5/2014 | Sakamoto | H10W 74/129 257/773 |
| 2015/0091432 | A1 | 4/2015 | Tsuda | |
| 2015/0364661 | A1 | 12/2015 | Sawada et al. | |
| 2018/0082936 | A1 * | 3/2018 | Syu | H10W 90/401 |
| 2019/0043794 | A1 * | 2/2019 | Kapusta | H10W 70/635 |
| 2019/0198432 | A1 * | 6/2019 | Matsuzawa | H10W 70/685 |
| 2020/0066611 | A1 | 2/2020 | Egawa | |
| 2020/0212277 | A1 * | 7/2020 | Ozeki | H10H 20/856 |
| 2020/0357770 | A1 * | 11/2020 | Chiang | H10W 90/00 |
| 2020/0403133 | A1 * | 12/2020 | Yoo | H10H 20/8582 |
| 2021/0041089 | A1 | 2/2021 | Inayoshi et al. | |
| 2021/0091053 | A1 * | 3/2021 | Sakamaki | H10W 90/00 |
| 2021/0366839 | A1 * | 11/2021 | Otsubo | H10W 40/778 |
| 2022/0028774 | A1 * | 1/2022 | Murayama | H10W 90/401 |
| 2022/0093480 | A1 * | 3/2022 | Vepakomma | H10W 74/121 |
| 2024/0164008 | A1 * | 5/2024 | Yao | H05K 1/0209 |
| 2024/0203901 | A1 * | 6/2024 | Ohda | H10W 42/20 |
| 2024/0312976 | A1 * | 9/2024 | Niwa | H10W 72/075 |

FOREIGN PATENT DOCUMENTS

| | | |
|---|---|---|
| TW | M341931 | 10/2008 |
| TW | 201025523 | 7/2010 |
| TW | 202228255 | 7/2022 |

OTHER PUBLICATIONS

Michele Miliciani et al., "In-mold electronics applications: the control of ink properties through the use of mixtures of electrically conductive pastes", Flexible and Printed Electronics, Aug. 30, 2023, pp. 1-11, vol. 8, No. 3.
Freddie Hong et al., "Vacuum-formed 3D printed electronics: fabrication of thin, rigid and free-form interactive surfaces", arXiv:2104.12601, Apr. 27, 2021, pp. 1-9.
"Office Action of Taiwan Counterpart Application", issued on Apr. 22, 2024, p. 1-p. 5.

* cited by examiner

MOLDED ELECTRONIC ASSEMBLY

CROSS-REFERENCE TO RELATED APPLICATION

This application claims the priority benefit of U.S. provisional application Ser. No. 63/424,490, filed on Nov. 11, 2022, and Taiwan application serial no. 112141687, filed on Oct. 31, 2023. The entirety of each of the above-mentioned patent applications is hereby incorporated by reference herein and made a part of this specification.

TECHNICAL FIELD

The disclosure relates to a molded electronic assembly.

BACKGROUND

In the context of a light emitting diode (LED) and its encapsulation process using a molded electronic assembly, it has been observed that an increase in the overall heating temperature of the molded electronic assembly, specifically from 40° C. to 100° C., results in a significant reduction in the lifespan of the LED encapsulated therein from 20,000 hours to 5,000 hours.

In light of the foregoing, in molded electronic products, electronic devices encapsulated in the mold and integrated modules results in an issue of heat concentration, which leads to a decline in an operational efficiency of the electronic devices, consequently causing the plastic structure to be damaged, and affecting the reliability and the lifespan of the products.

Therefore, heat dissipation of the molded electronic products is an issue that needs to be resolved.

SUMMARY

One or more of the exemplary embodiments provide a molded electronic assembly capable of achieving favorable heat dissipation effects.

One of the exemplary embodiments provides a molded electronic assembly that includes a circuit substrate, a plurality of electronic devices, and at least one patterned heat dissipation structure. The circuit substrate includes a substrate and a circuit, where the substrate has a top surface, the circuit has a plurality of signal contacts, and the signal contacts are distributed on the top surface. The electronic devices are disposed on the circuit substrate, and each of the electronic devices has a plurality of device pins connected to the signal contacts. The at least one patterned heat dissipation structure corresponds to a signal contact of the signal contacts and starts from the corresponding signal contact and extends toward a plurality of directions on the top surface of the substrate.

One of the exemplary embodiments provides a molded electronic assembly that includes a circuit substrate, a plurality of electronic devices, a patterned heat dissipation structure, and a decorative layer. The circuit substrate includes a substrate and a circuit, where the substrate has a top surface, the circuit has a plurality of signal contacts, and the signal contacts are distributed on the top surface. The electronic devices are disposed on the circuit substrate, and each of the electronic devices has a plurality of device pins connected to the signal contacts. The patterned heat dissipation structure has a heat conductive coefficient ≥6 W/mK and has a first transparent region. The decorative layer is located on one side of the circuit substrate and has a second transparent region. Here, a region where the first transparent region is orthogonally projected on the substrate is overlapped with and greater than a region where the second transparent region is orthogonally projected on the substrate, and the region where the first transparent region is orthogonally projected on the substrate is not overlapped with a region where the electronic devices are orthogonally projected on the substrate.

Based on the above, in the molded electronic assembly provided in one or more embodiments of the disclosure, the patterned heat dissipation structure is structurally designed to extend toward a plurality of directions on the top surface of the substrate, and therefore the heat from the electronic devices may be dissipated in a plurality of directions, which effectively enhances the overall heat dissipation effect of the molded electronic assembly.

BRIEF DESCRIPTION OF THE DRAWINGS

The accompanying drawings are included to provide a further understanding of the disclosure, and the accompanying drawings are incorporated in and constitute a part of this specification. The drawings illustrate the embodiments of the disclosure, and together with the description, serve to explain the principle of the disclosure.

DETAILED DESCRIPTION OF DISCLOSED EMBODIMENTS

The illustrations presented within the disclosure are purely schematic in nature, primarily serving the purpose of illustrating the interplay among different devices, and the shapes and dimensions depicted in these illustrations are not necessarily drawn to scale.

Figure 1A:
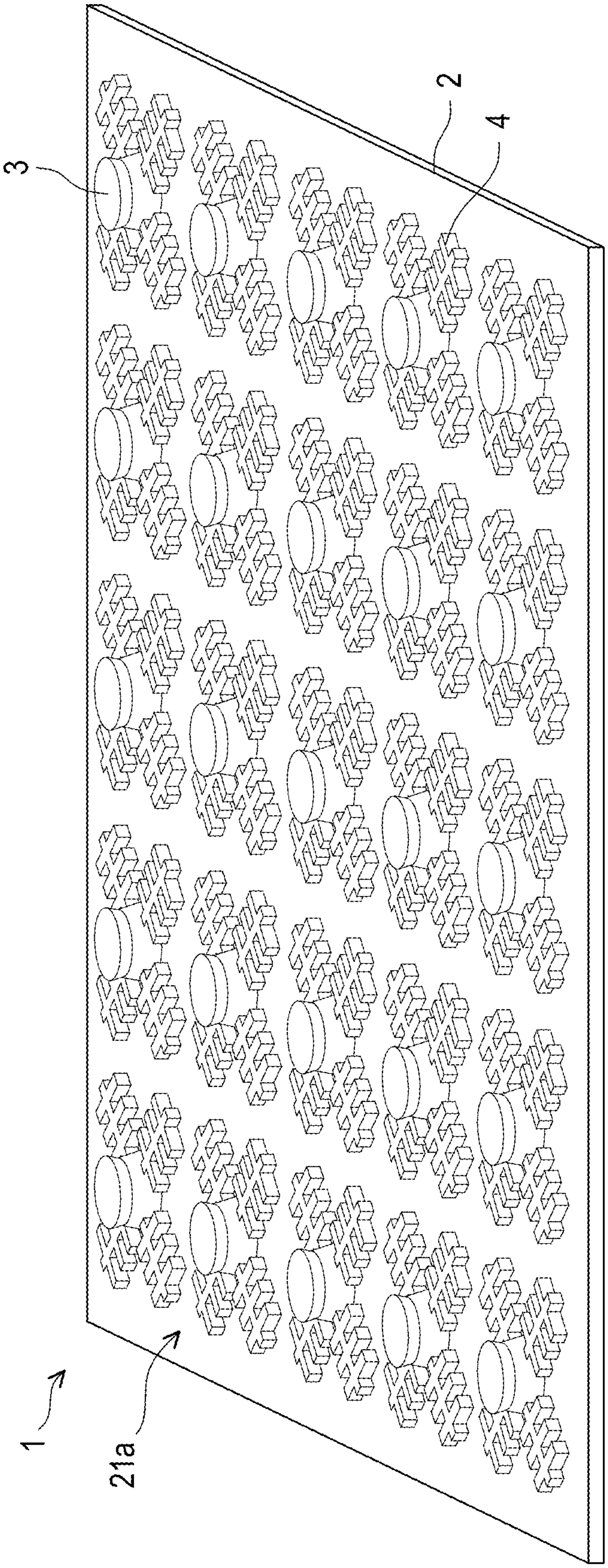
FIG. 1A is a schematic three-dimensional view illustrating a molded electronic assembly according to an embodiment of the disclosure.
Figure 2A:
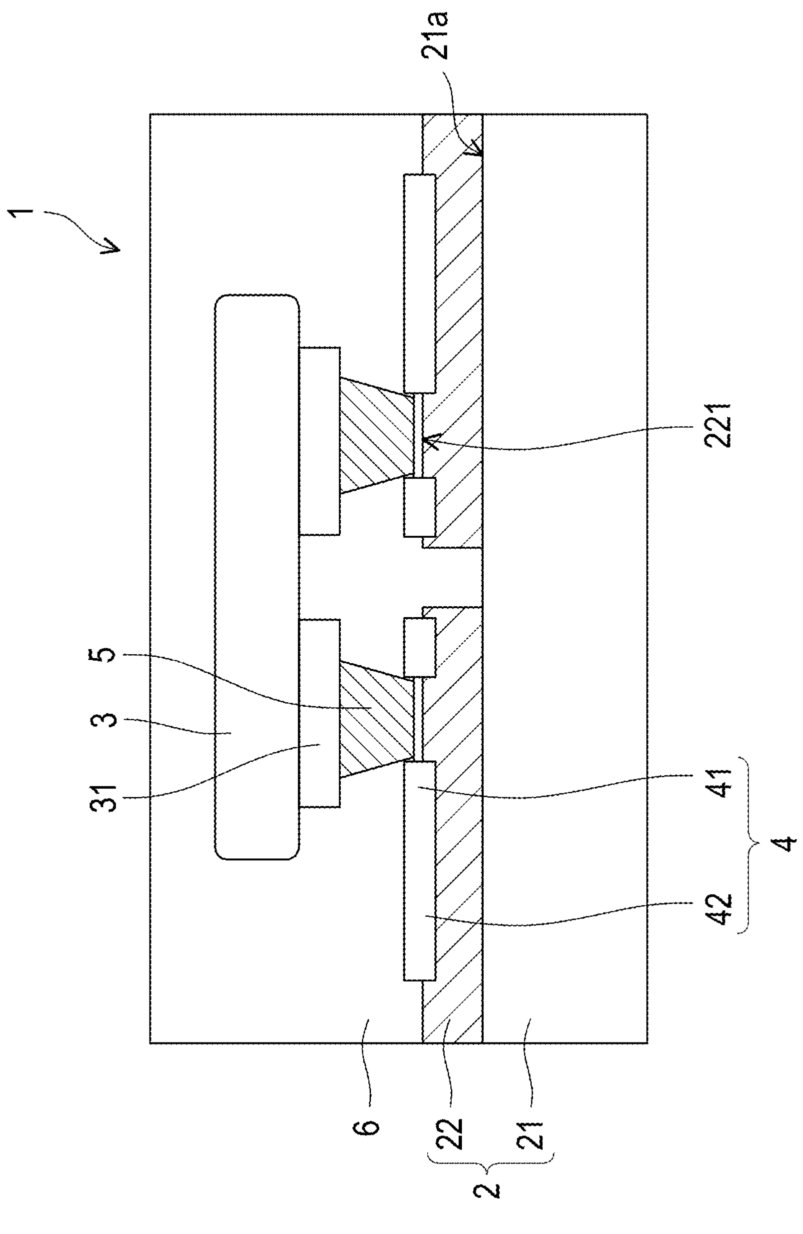
FIG. 2A is a schematic partial view of FIG. 1A.

FIG. 1A is a schematic three-dimensional view illustrating a molded electronic assembly according to an embodiment of the disclosure, and FIG. 2A is a schematic partial view of FIG. 1A. With reference to both FIG. 1A and FIG. 2A, a molded electronic assembly 1 includes a circuit substrate 2, a plurality of electronic devices 3, and at least one patterned heat dissipation structure 4. The circuit substrate 2 includes a substrate 21 and a circuit 22, where the substrate 21 has atop surface 21*a*, the circuit 22 has a plurality of signal contacts 221, and the signal contacts 221 are distributed on the top surface 21*a*. The electronic devices 3 are disposed on the circuit substrate 2, each of the electronic devices 3 has a plurality of device pins 31, and the device pins 31 are connected to the signal contacts 221. In the present embodiment, the number of the at least one patterned heat dissipation structure 4 is a plural, each of the patterned heat dissipation structures 4 corresponds to one of the signal contacts 221, and each of the patterned heat dissipation structures 4 starts from the corresponding signal contact 221 and extends toward a plurality of directions on the top surface 21*a* of the substrate 21.

In the present embodiment, the electronic devices 3 may be light emitting diodes (LEDs), integrated circuits (ICs), microcontrollers (MCUs), resistors, capacitors, inductors, potentiometers, transformers, diodes, triodes, transistors, power modules, switches, connectors, or batteries, which may be determined according to actual needs. Here, the device pins 31 of the electronic devices 3 are electrically connected to the corresponding signal contacts 221 through a conductive glue 5. In addition, each of the patterned heat dissipation structures 4 has a heat input terminal 41 and a plurality of heat output terminals 42, where the heat output terminals 42 start from the heat input terminal 41 and extend toward a plurality of directions. The heat input terminal 41 is adjacent to the corresponding device pin 31 or the corresponding signal contact 221, and the heat input terminal 41 is configured to collect heat generated by the operation of the electronic devices 3. The heat output terminals 42 starting from the heat input terminal 41 extend in different directions on the top surface 21*a* of the substrate 21 to dissipate the heat collected by the heat input terminal 41.

As described above, since the patterned heat dissipation structures 4 provide heat dissipation paths in a plurality of directions, the heat generated during the operation of the electronic devices 3 may be effectively dissipated, thereby ensuring the molded electronic assembly 1 to achieve a satisfactory heat dissipation effect.

Incidentally, the patterned heat dissipation structures 4 in FIG. 1A are evenly distributed on the top surface 21*a* of the substrate 21; that is, the shape of each of the patterned heat dissipation structures 4 is similar to the shape of another adjacent patterned heat dissipation structure 4, which should however not be construed as a limitation in the disclosure.

Figure 1B:
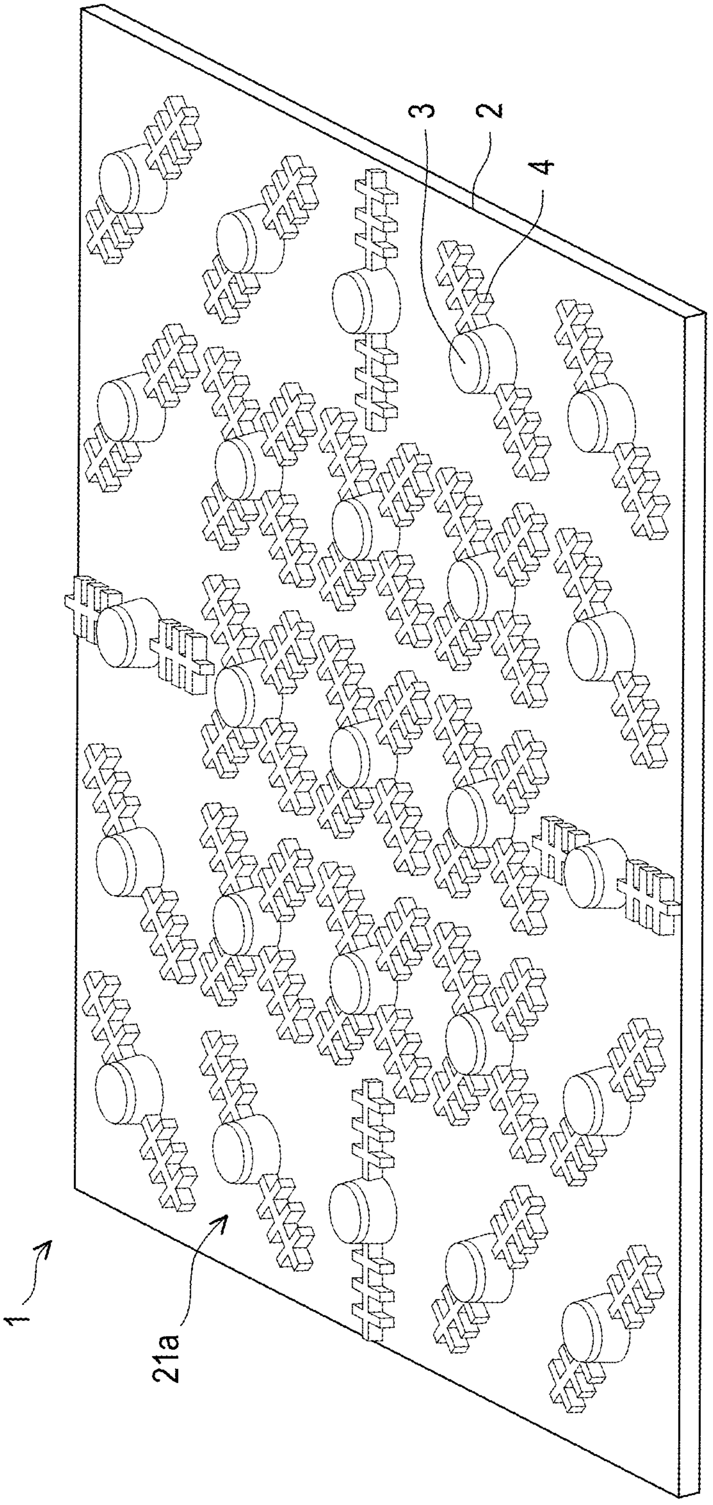
FIG. 1B illustrates another distribution manner of patterned heat dissipation structures on a top surface of a substrate.

FIG. 1B illustrates another distribution manner of patterned heat dissipation structures on a top surface of a substrate. As shown in FIG. 1B, the distribution manner of the patterned heat dissipation structures on the top surface can be changed according to actual needs. Specifically, four patterned heat dissipation structures 4 are distributed around each signal contact 221 at the center of the substrate, and the four patterned heat dissipation structures 4 are arranged around the corresponding signal contact 221 at equal angles. On the other hand, two patterned heat dissipation structures 4 are distributed around each signal contact 221 at the edge of the substrate 21, and the two patterned heat dissipation structures 4 are symmetrically disposed with respect to the corresponding signal contact 221 as the center of symmetry.

In the present embodiment, a heat conductive coefficient of the patterned heat dissipation structures 4 is ≥6 W/mK, where the patterned heat dissipation structures 4 include a polymer matrix or silicone grease accounting for 20% to 70% by volume and a heat conductive filler, where the heat conductive filler may include metals (e.g., aluminum, aluminum oxide, copper, magnesium, brass, silver, tin, and so on) or other materials with high thermal conductivity (e.g., allotropes of carbon), but the material of the patterned heat dissipation structures 4 is not limited to the materials mentioned above.

Figure 2B:
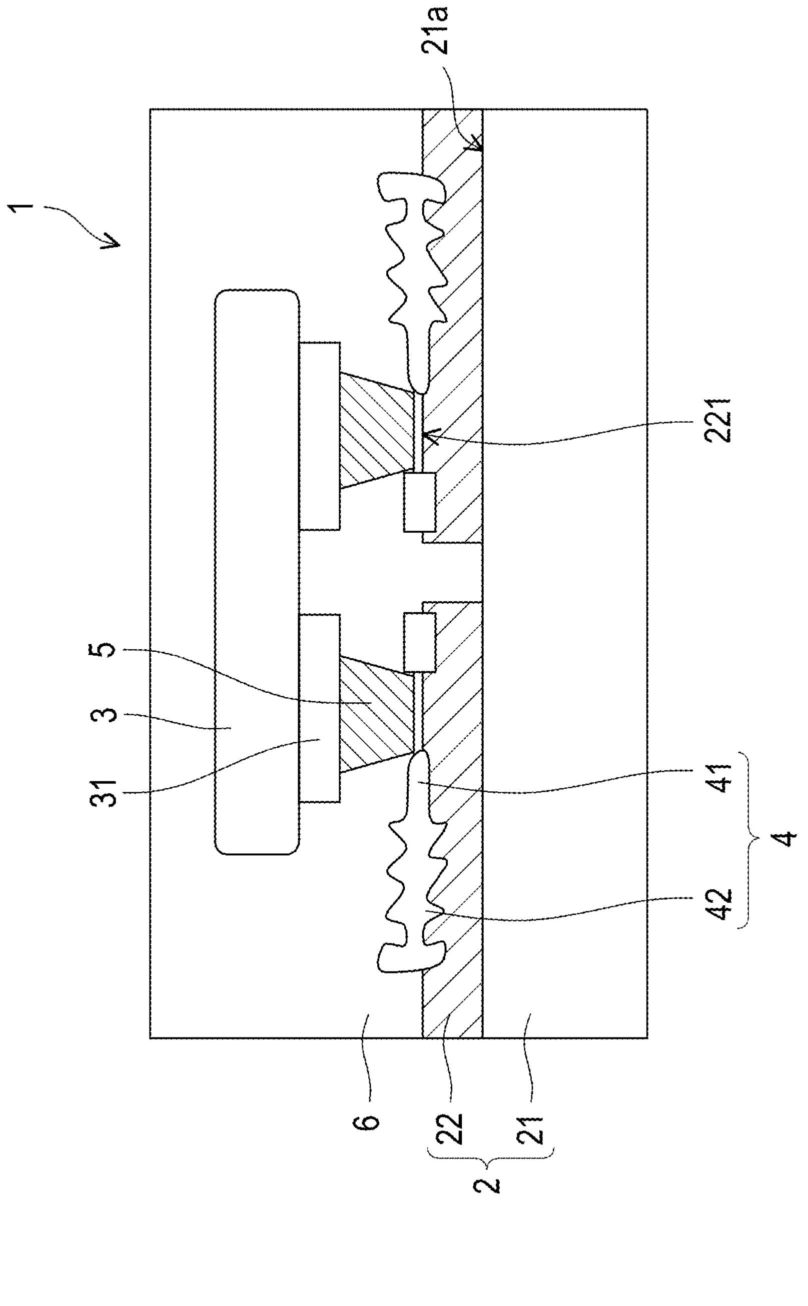
FIG. 2B is a schematic view highlighting the patterned heat dissipation structure depicted in FIG. 2A.
Figure 3:
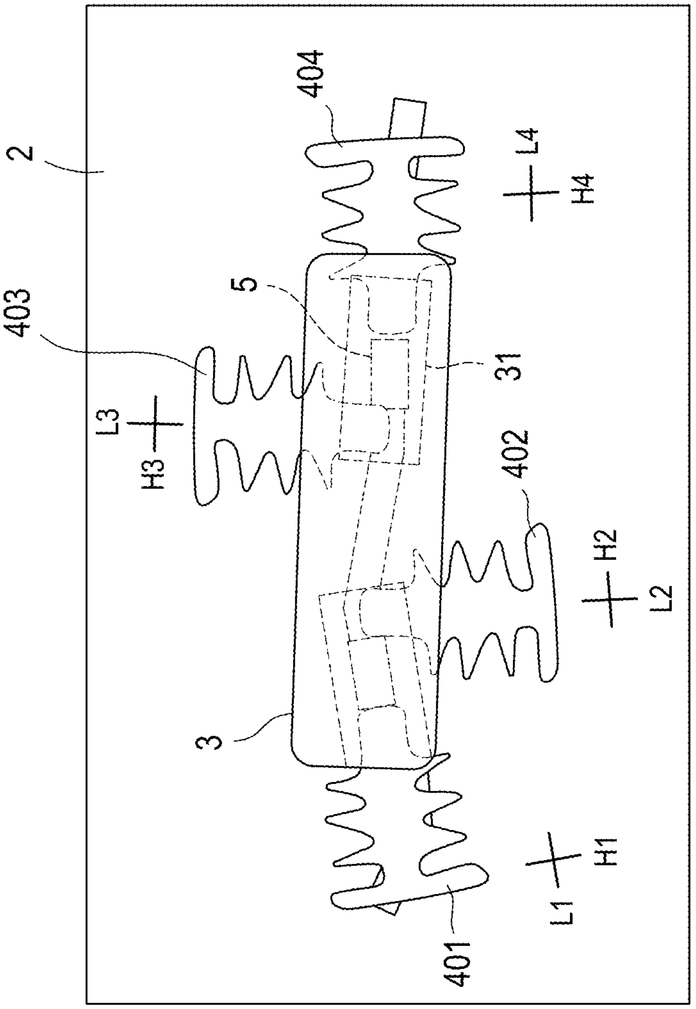
FIG. 3 is a top view illustrating a molded electronic assembly according to an embodiment of the disclosure.

The patterned heat dissipation structures 4 may have an aspect ratio of 5:1 in a planar direction, where the longitudinal direction is a direction of the length of the longest part in the patterned heat dissipation structures 4, and the transverse direction is a direction perpendicular to the length direction. FIG. 2B is a schematic view highlighting the patterned heat dissipation structure depicted in FIG. 2A, and FIG. 3 is a top view illustrating a molded electronic assembly 1 according to an embodiment of the disclosure. In order to separate the patterned heat dissipation structures 4 from other devices in a cross-sectional view, note that the patterned heat dissipation structures in FIG. 2B are depicted in a fishbone shape, and the patterned heat dissipation structures in the subsequent cross-sectional views are also depicted in a fishbone shape. However, it should be understood that the actual shape of the patterned heat dissipation structures in a cross-section should be the shape of the patterned heat dissipation structures 4 shown in FIG. 2A.

With reference to FIG. 2B and FIG. 3, each of four patterned heat dissipation structures 401, 402, 403, and 404 in the molded electronic assembly 1 has a transverse direction H1-H4 and a longitudinal direction L1-L4, respectively, where the longitudinal directions L1 and L4 of two of the patterned heat dissipation structures 401 and 404 are substantially parallel, and the longitudinal directions L2 and L3 of the other two patterned heat dissipation structures 402 and 403 are substantially parallel. Therefore, the transverse directions H1 and H4 of the patterned heat dissipation structures 401 and 404 are substantially parallel, and the transverse directions H2 and H3 of the patterned heat dissipation structures 402 and 403 are substantially parallel.

Here, being substantially parallel may refer to being completely parallel or approximately parallel.

Besides, although only four patterned heat dissipation structures 401, 402, 403, and 404 are shown in FIG. 3, this should not be construed as a limitation. Under appropriate spatial configuration design, the number of the patterned heat dissipation structures 4 may be selected according to actual needs.

Incidentally, as can be observed from FIG. 3, the patterned heat dissipation structures 4 are designed to extend toward a plurality of directions rather than extending along one single specific direction.

With reference to FIG. 1A, FIG. 2B, and FIG. 3, a material of the substrate 21 may include polyethylene terephthalate (PET), ethylene terephthalate co-1,4-cyclohexylene dimethylene terephthalate (PETG), polycarbonate (PC), polyimide (PI), polymethyl methacrylate (PMMA), polyethersulfone (PES), polydimethylsiloxane (PDMS), acrylonitrile butadiene styrene (ABS), acrylic, or a combination thereof, and a thickness of the substrate 21 ranges from 0.1 mm to 5 mm. The material of the substrate 21 may be determined according to actual needs, and the thickness of the substrate 21 may be designed according to actual needs.

In addition, a material of the circuit 22 includes metal, a conductive polymer, or a mixture of a conductive polymer and conductive particles, where the conductive particles include metal particles (e.g., gold, silver, copper, aluminum, molybdenum, nickel, tungsten, metal alloys thereof, or oxides thereof) or allotropes of carbon, such as carbon black, fullerene, carbon nanotubes, graphite, graphene, and so on, but the conductive particles are not limited to the above-mentioned conductive materials and combinations thereof. Alternatively, the material of the circuit 22 may also be selected from conductive polymer materials, which include polyacetylene, polyphenylene, polypyrrole, polythiophene, and polyaniline, and so on, but the material of the circuit 22 is not limited to the above-mentioned conductive polymer materials and combinations thereof.

The shape of the conductive particles includes a granular shape, a flaky shape, a needle-like shape, a blocky shape, and any irregular shape, which may be determined according to actual needs.

In addition to conducting electrical signals, the circuit 22 is also capable of conducting heat.

The molded electronic assembly 1 further includes a first cover layer 6 disposed on the substrate 21, and the first cover layer 6 covers the patterned heat dissipation structures 4 and at least parts of the electronic devices 3. A material of the first cover layer 6 may be selected from any of acrylic, epoxy, phenol, polyester, urethane, silicone, PI, and PC or combinations thereof.

As shown in FIG. 2A, a height of the first cover layer 6 is greater than a height of the electronic devices 3. In an embodiment of the disclosure, the first cover layer 6 may be formed to cover all the electronic devices 3 and a surface of the circuit substrate 2 on the circuit substrate 2, or each individual electronic device 3 may be respectively covered by the first cover layer 6.

In the molded electronic assembly 1 provided in the disclosure, the heat conductive coefficient of the patterned heat dissipation structures 4>>a heat conductive coefficient of the substrate 21>a heat conductive coefficient of the first cover layer 6, and a heat conductive coefficient of the circuit 22>>the heat conductive coefficient of the substrate 21>the heat conductive coefficient of the first cover layer 6. Such a relationship of the heat conductive coefficients is conducive to enhancing the overall heat dissipation performance of the molded electronic assembly 1.

In other embodiments of the disclosure, relative heights of the first cover layer 6 and the electronic devices 3 may also be different.

Figure 4A:
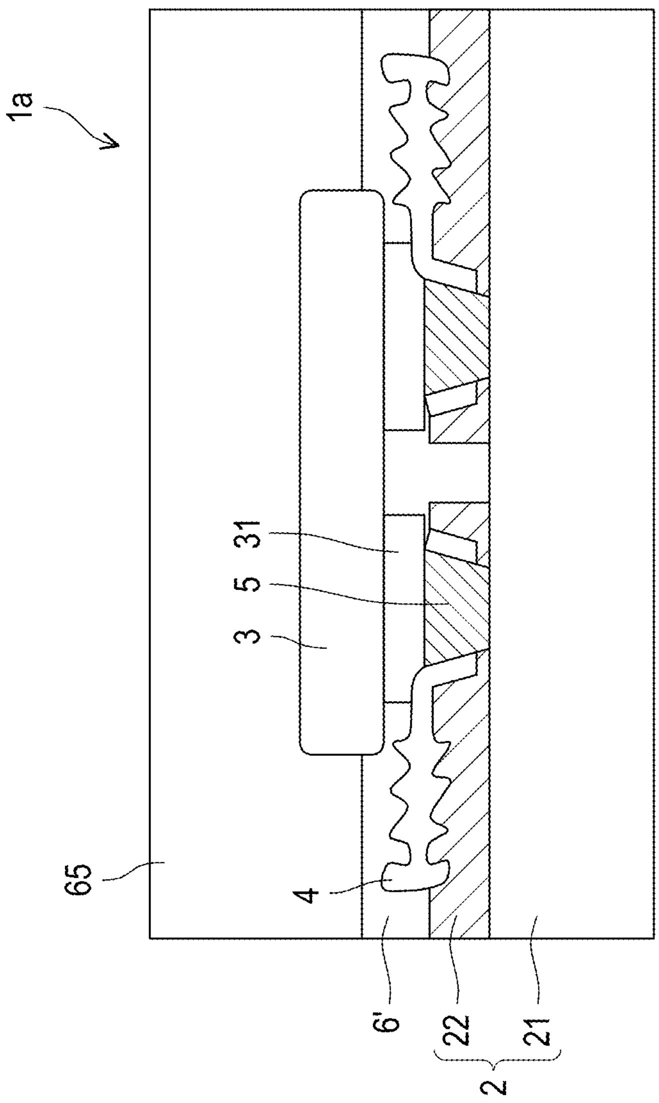
FIG. 4A is a schematic view illustrating a molded electronic assembly according to an embodiment of the disclosure, where a height of a first cover layer is less than a height of electronic devices.

FIG. 4A is a schematic view illustrating a molded electronic assembly according to an embodiment of the disclosure, where a height of a first cover layer is less than a height of electronic devices. In the embodiment as shown in FIG. 4A, when the electronic devices 3 are LEDs, if a height of the cover layer 6' is less than the height of the electronic devices 3, lateral light scattering effects may be mitigated.

In addition, the molded electronic assembly 1*a* further includes a second cover layer 65, where the first cover layer 6' is located between the second cover layer 65 and the substrate 21, and the second cover layer 65 covers the electronic devices 3. In this embodiment, a Young's coefficient of the second cover layer 65 is greater than a Young's coefficient of the first cover layer 6', and a heat conductive coefficient of the second cover layer 65 is less than a heat conductive coefficient of the first cover layer 6'.

Figure 4B:
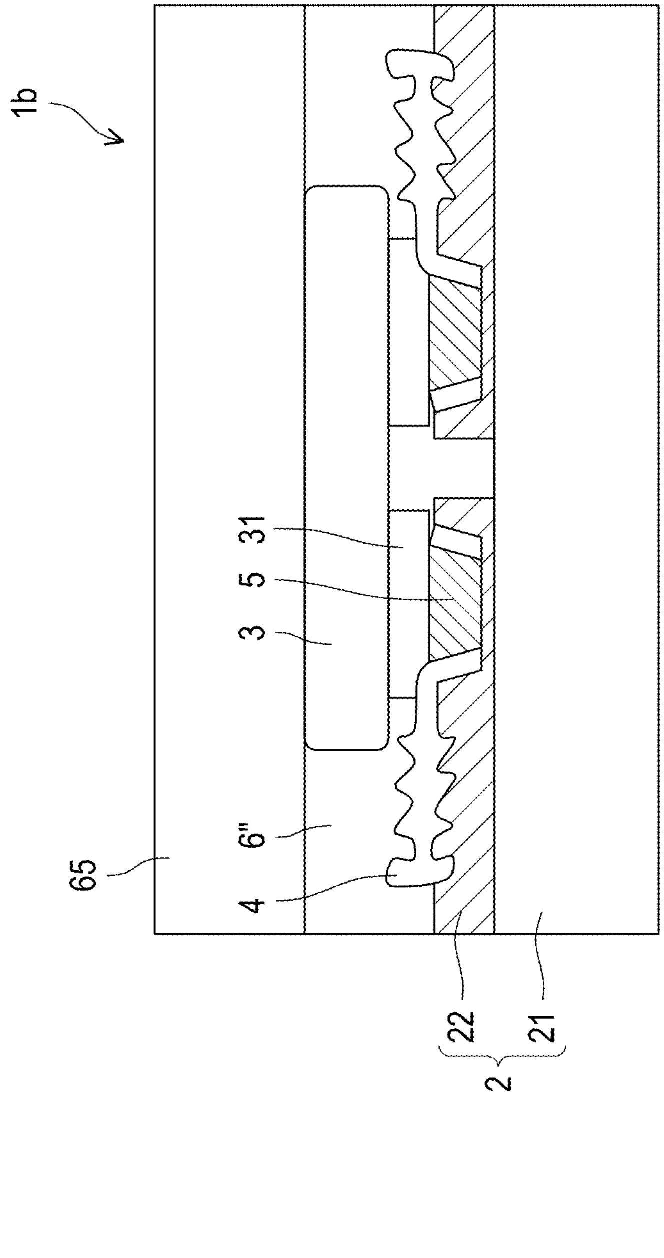
FIG. 4B is a schematic view illustrating a molded electronic assembly according to an embodiment of the disclosure, where the height of the first cover layer is equal to the height of the electronic devices.

FIG. 4B is a schematic view illustrating a molded electronic assembly according to an embodiment of the disclosure, where the height of the first cover layer is equal to the height of the electronic devices. In the embodiment as shown in FIG. 4B, a height of a first cover layer 6" of a molded electronic assembly 1*b* is equal to the height of the electronic devices 3, and the second cover layer 65 as shown in FIG. 4A may also be disposed on the first cover layer 6".

Figure 4C:
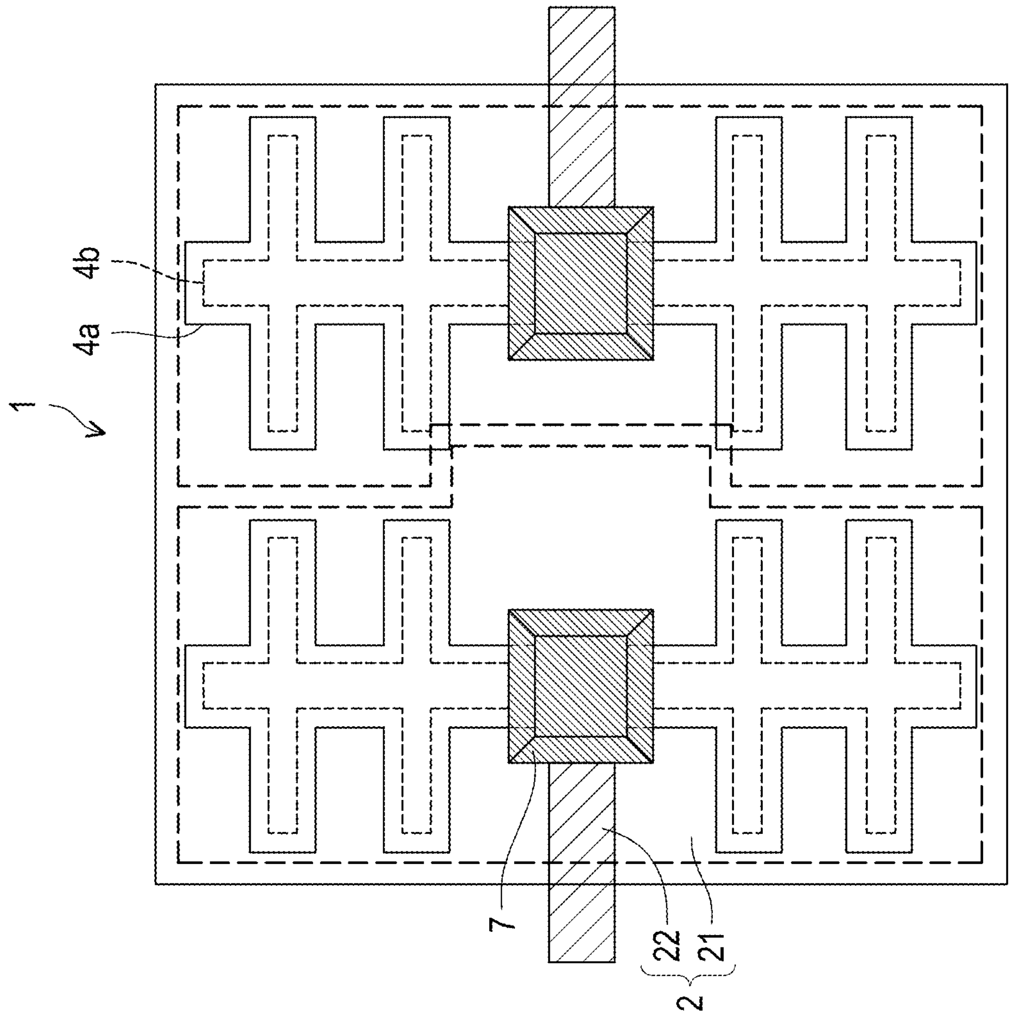
FIG. 4C is a schematic view illustrating patterned heat dissipation structures having different areas.

It is worth mentioning that the patterned heat dissipation structures 4 made of the same material may achieve different heat dissipation effects due to different thicknesses of or areas occupied by the patterned heat dissipation structures 4. Specifically, the patterned heat dissipation structures 4 with a relatively large overall volume achieve enhanced heat dissipation effects. FIG. 4C is a schematic view illustrating patterned heat dissipation structures having different areas. As shown in FIG. 4C, when the patterned heat dissipation structures are made of the same material and have the same thickness, heat dissipation effects achieved by a patterned heat dissipation structure 4*a* occupying a relatively large are greater than heat dissipation effects achieved by a patterned heat dissipation structure 4*b* occupying a relatively small area.

Figure 5A:
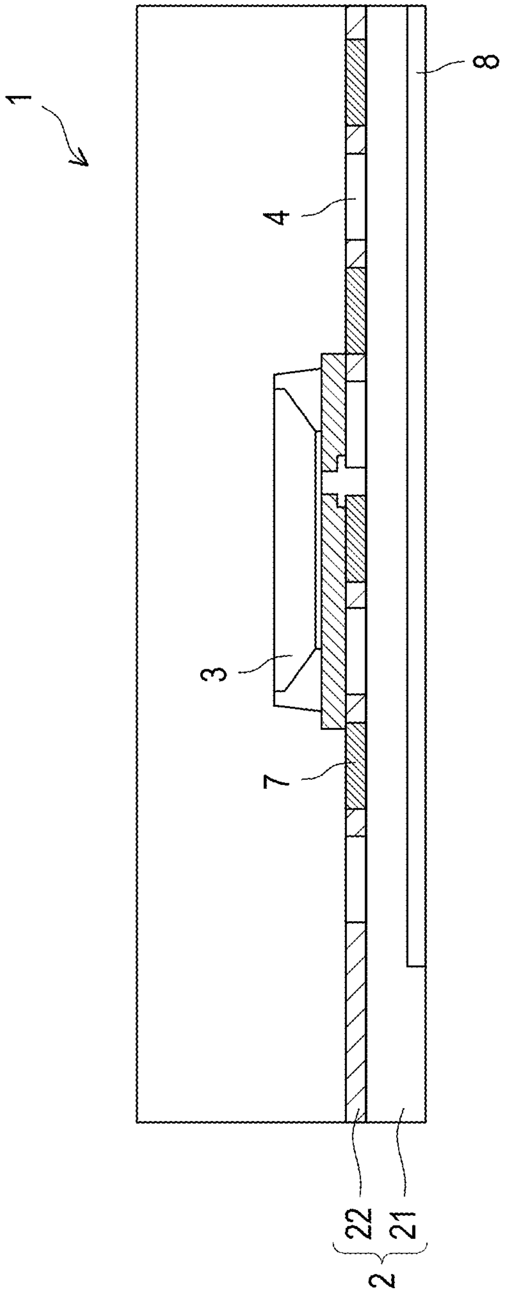
FIG. 5A is a schematic cross-sectional view of using a heat conductive material in a molded electronic assembly according to an embodiment of the disclosure, where the heat conductive material and a circuit are coplanar.

FIG. 5A is a schematic cross-sectional view of using a heat conductive material in a molded electronic assembly according to an embodiment of the disclosure, where the heat conductive material and a circuit are coplanar. With reference to FIG. 5A, the molded electronic assembly 1 further includes a heat conductive material 7 disposed on the substrate 21 and surrounding the device pins 31, where the heat conductive material 7 and the circuit 22 are coplanar, and the heat conductive material 7 includes a heat conductive silicon material, a graphite sheet, or a mixture of metal particles and a polymer material.

Given that the heat conductive material 7 and the circuit 22 are coplanar, the heat dissipation area may be expanded, so as to allow heat to quickly spread on the plane and prevent a temperature increase caused by the heat due to limitations of the upper/lower material with a relatively low heat conductive coefficient. When the graphite material is chosen as the heat conductive material 7, the planar diffusion performance may be enhanced on the same thickness condition, thus effectively improving the heat dissipation effect of the molded electronic assembly 1.

Figure 5B:
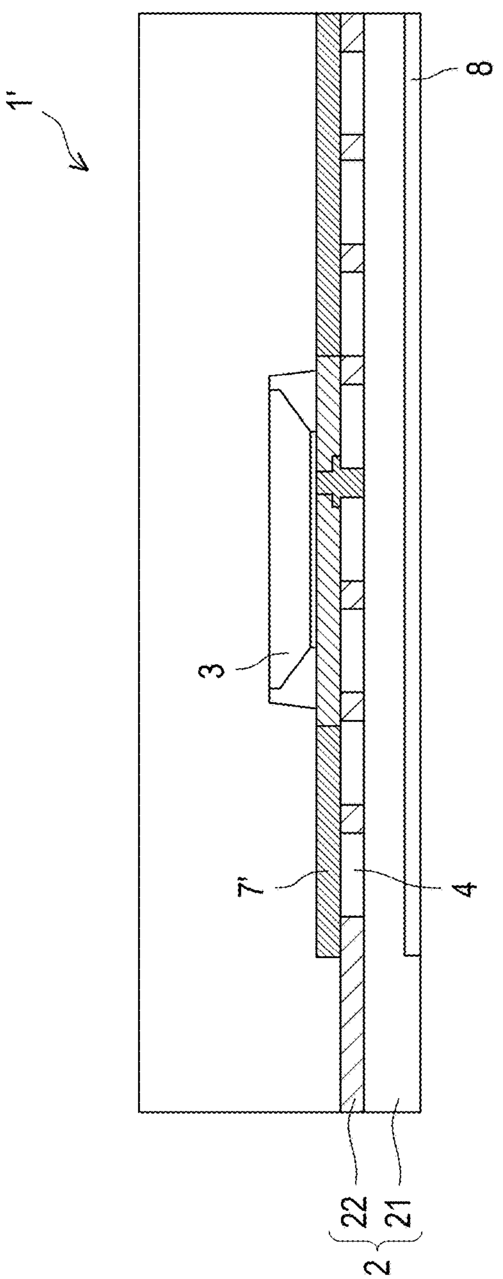
FIG. 5B is a schematic cross-sectional view illustrating a molded electronic assembly according to an embodiment of the disclosure, where the heat conductive material is located above the circuit.

FIG. 5B is a schematic cross-sectional view illustrating a molded electronic assembly according to an embodiment of the disclosure, where the heat conductive material is located above the circuit. In the implementation manner shown in FIG. 5B, a heat conductive material 7' covers at least one portion of the patterned heat dissipation structures 4 and at least one portion of the circuit 22. As such, the heat dissipation area occupied by and the thickness of a molded electronic assembly 1' may be changed, a path thermal resistance may be reduced, and the balance of the heat flow on both sides of the electronic devices 3 may be achieved.

Figure 5C:
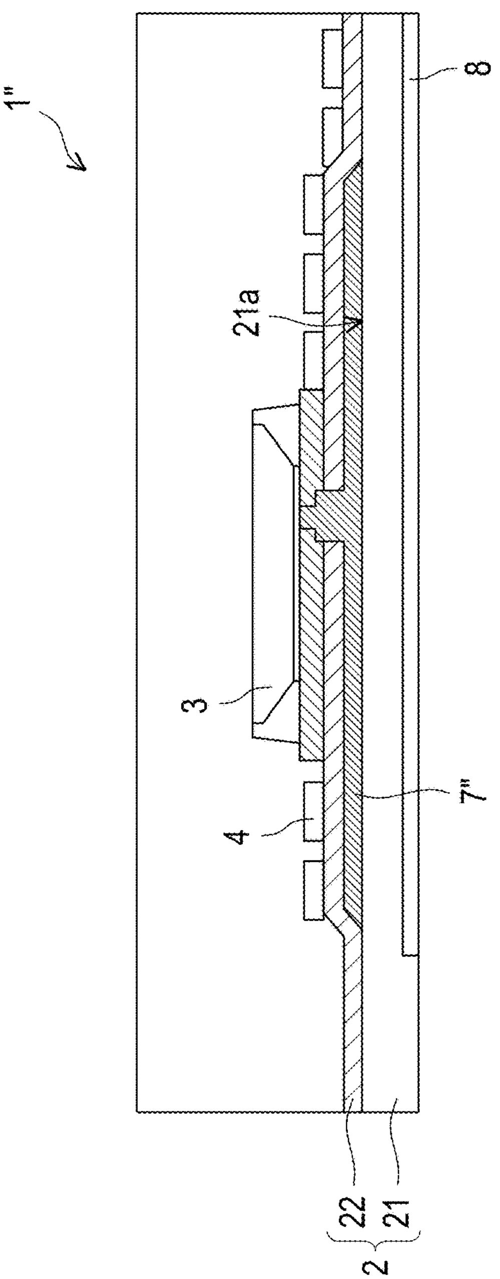
FIG. 5C is a schematic cross-sectional view illustrating a molded electronic assembly according to an embodiment of the disclosure, where the heat conductive material is located below the circuit.

FIG. 5C is a schematic cross-sectional view illustrating a molded electronic assembly according to an embodiment of the disclosure, where the heat conductive material is located below the circuit. In the implementation manner shown in FIG. 5C, a heat conductive material 7" is located between the circuit 22 and the top surface 21*a*. By positioning the heat conductive material 7" between the circuit 22 and the top surface 21*a*, a heat dissipation pathway for the material of the circuit 22 may be increased. Given that the circuit 22 serves dual functions of providing conductivity and heat dissipation capabilities, it contributes to an enhanced overall heat dissipation effect for a molded electronic assembly 1".

Since the molded electronic assembly 1 is integrated with in-mold decoration (IMD), note that a decorative layer 8 is coated to the bottom of the substrate 21.

Figure 6A:
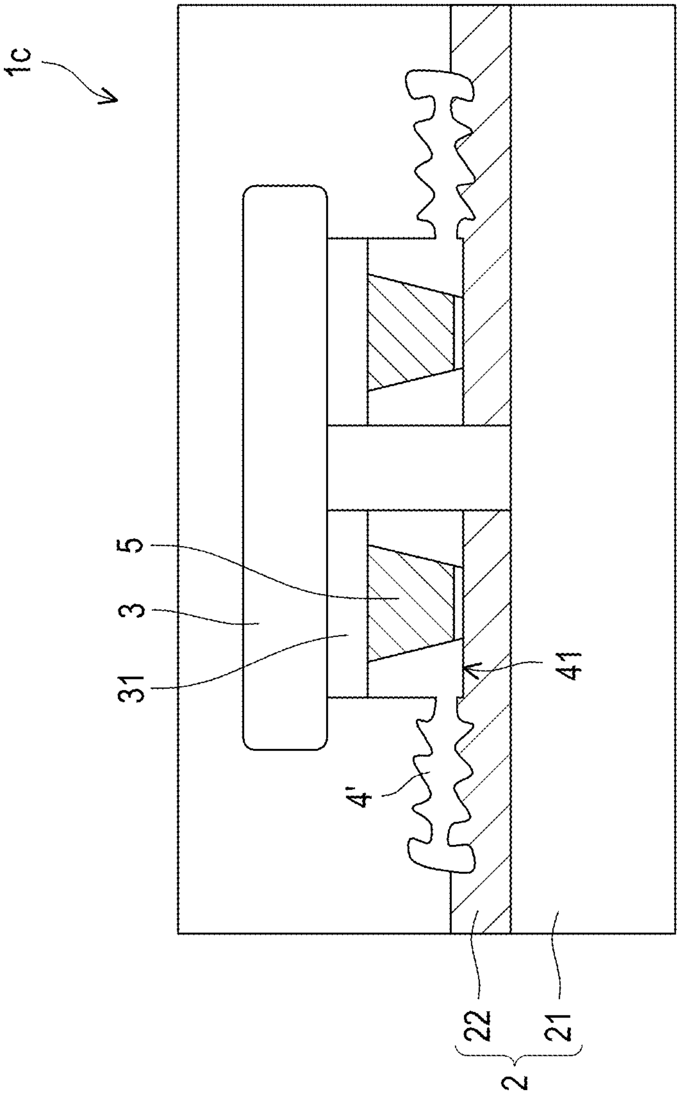
FIG. 6A and FIG. 6B are schematic views illustrating patterned heat dissipation structures extending upward to cover device pins in a molded electronic assembly according to an embodiment of the disclosure.
Figure 6B:
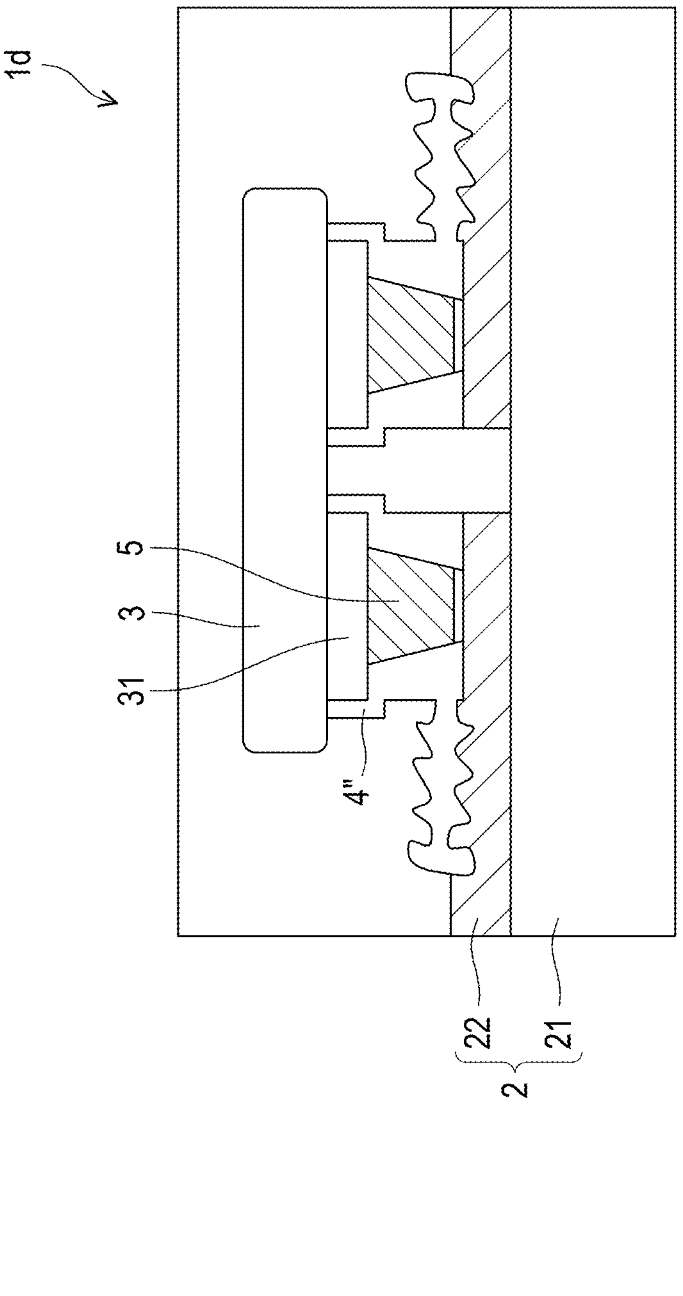

FIG. 6A and FIG. 6B are schematic views illustrating patterned heat dissipation structures extending upward to cover device pins in a molded electronic assembly according to an embodiment of the disclosure. With reference to FIG. 6A, each of patterned heat dissipation structures 4' in a molded electronic assembly 1*c* further extends upward to surround the periphery of the corresponding conductive glue 5. As such, a contact area between the heat input terminal 41 of the patterned heat dissipation structures 4' and the heat source may be increased. As shown in FIG. 6B, each of patterned heat dissipation structures 4" of the molded electronic assembly 1*d* may further extend upward to surround a side of the corresponding device pin 31.

Figure 7:
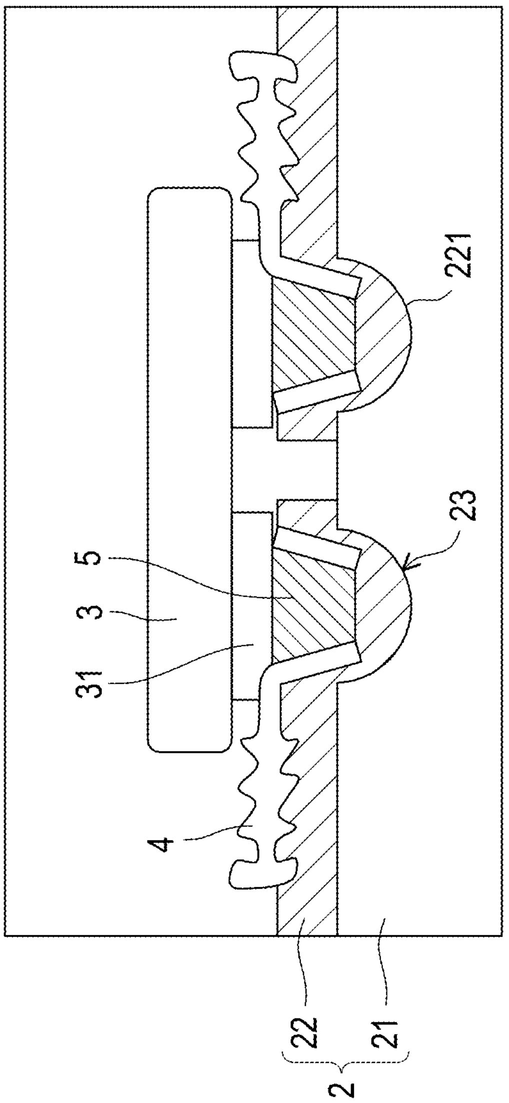
FIG. 7 is a schematic view illustrating a signal contact disposed in a groove of a substrate in a molded electronic assembly according to an embodiment of the disclosure.

FIG. 7 is a schematic view illustrating a signal contact disposed in a groove of a substrate in a molded electronic assembly according to an embodiment of the disclosure. With reference to FIG. 7, the substrate 21 differs from previous embodiments where the signal contacts 221 are situated on the flat top surface 21*a*. Instead, the substrate 21 in this embodiment features a plurality of grooves 23 recessed from the top surface 21*a*, where the signal contacts 221 are disposed in the grooves 23, and a portion of the conductive glue 5 is disposed in the grooves 23. The presence of the grooves 23 serves to prevent the conductive glue 5, which is connected to the signal contacts 221, from overflowing or spreading due to high-temperature softening, thereby mitigating the risk of short circuits among the signal contacts 221 or deviations in the contact positions.

Figure 8:
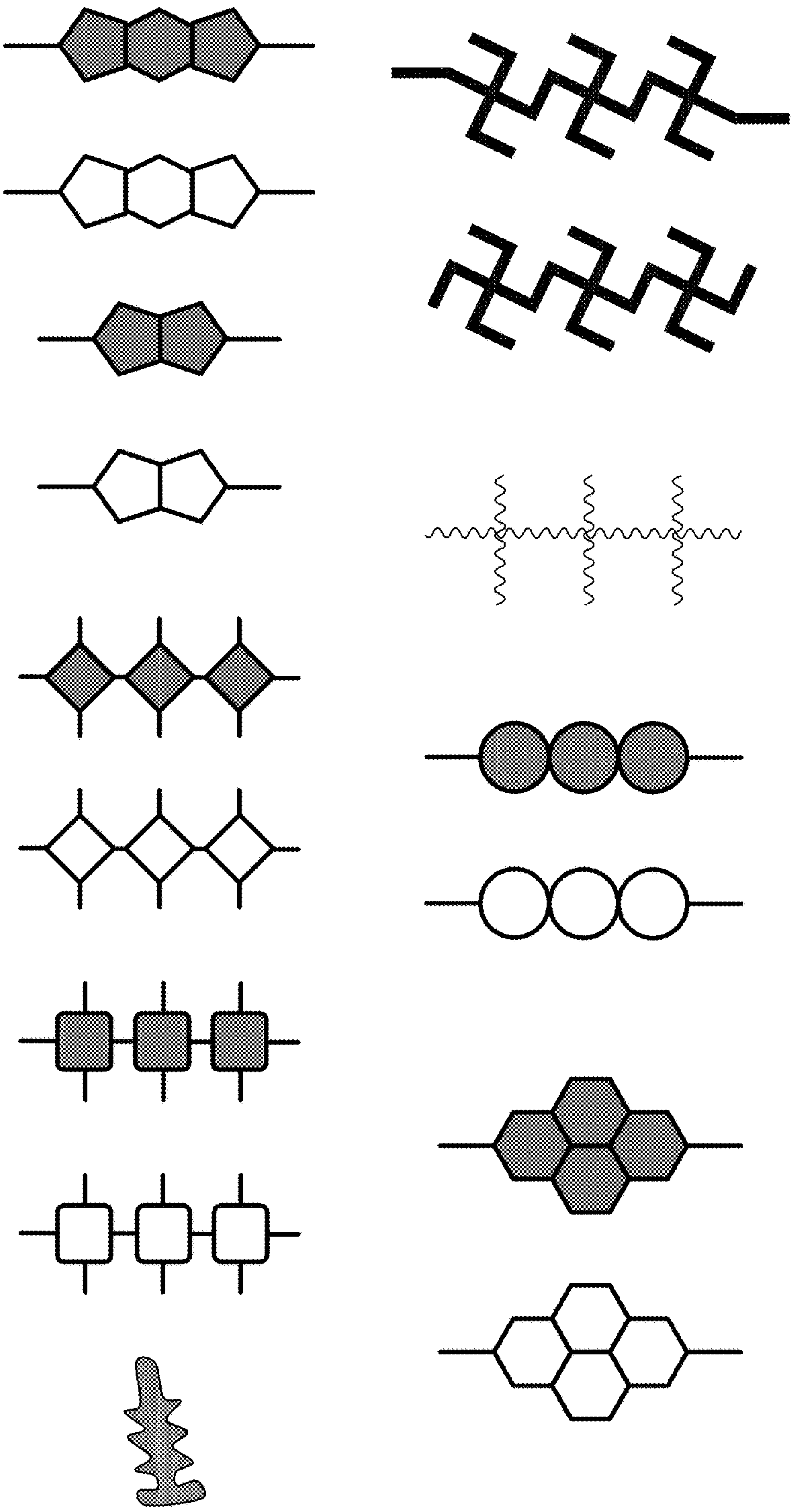
FIG. 8 is a schematic view illustrating various patterns of a patterned heat dissipation structure according to an embodiment of the disclosure.

FIG. 8 is a schematic view illustrating various patterns of a patterned heat dissipation structure according to an embodiment of the disclosure. With reference to FIG. 8, patterns of the patterned heat dissipation structures 4 may be selected according to actual needs, and the patterns of the patterned heat dissipation structures 4 shown in FIG. 8 may have a strip shape, a bar shape, a droplet shape, a fishbone shape, a square shape, a diamond shape, a pentagonal shape, a hexagonal shape, a honeycomb shape, a shape constituted by serpentine interlaces, a swastika disc shape, or a round ring shape, but the shape of the patterns is not limited to what is described above. In addition, the heat dissipation structures have plasticity and stretchability.

Figure 9A:
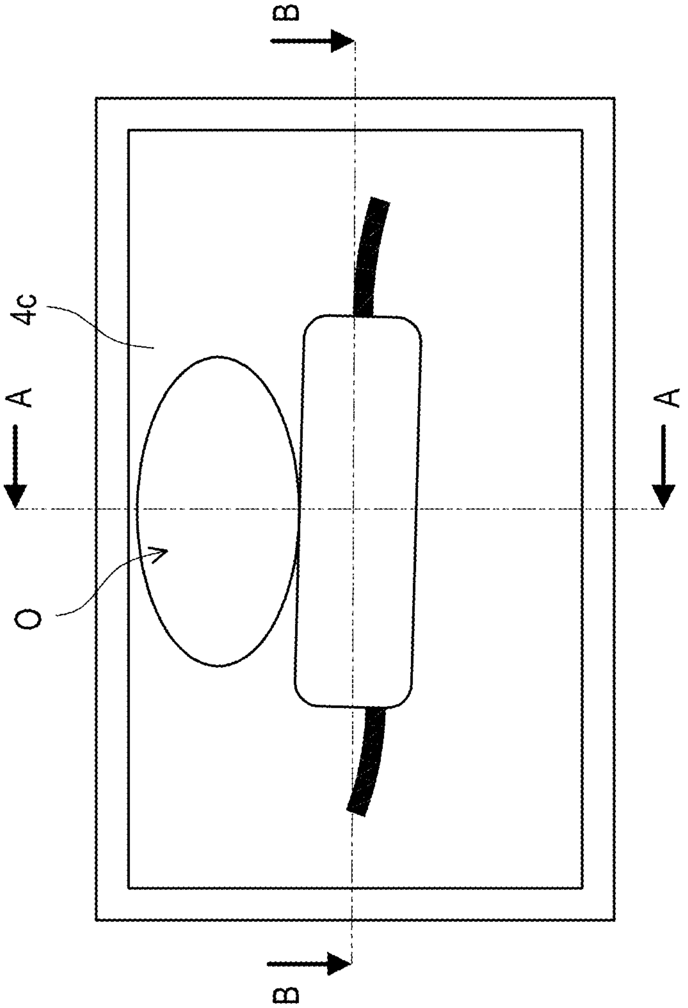
FIG. 9A is a schematic view illustrating a patterned heat dissipation structure entirely covering a top surface of a substrate according to an embodiment of the disclosure.
Figure 9B:
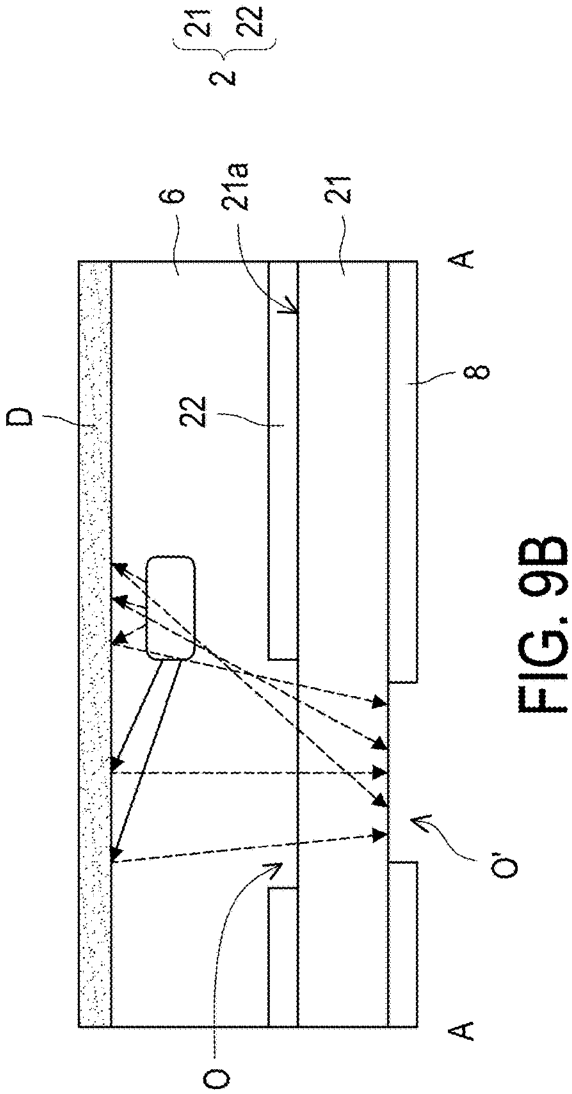
FIG. 9B is a cross-sectional view taken along a sectional line A-A in FIG. 9A.
Figure 9C:
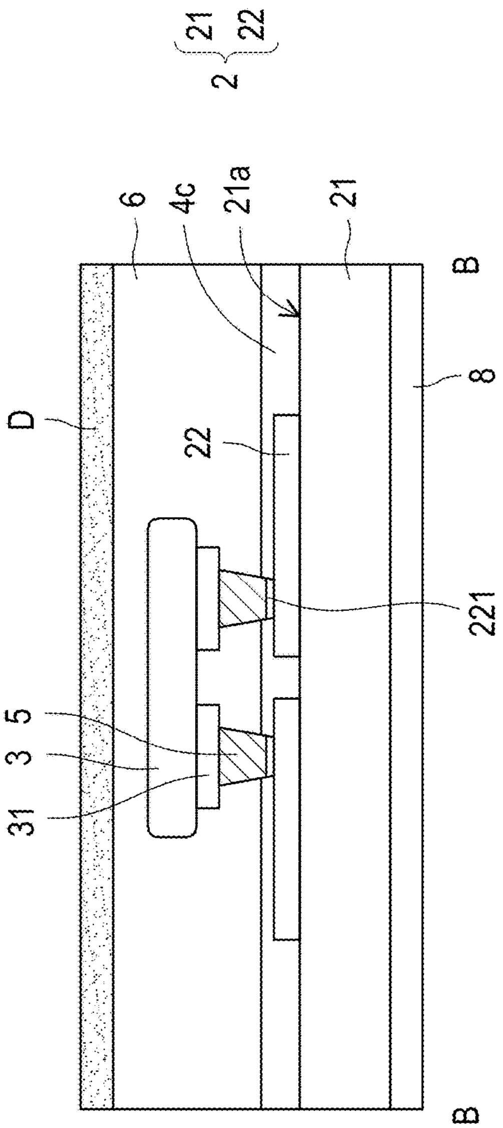
FIG. 9C is cross-sectional view taken along a sectional line B-B in FIG. 9A.

FIG. 9A is a schematic view illustrating a patterned heat dissipation structure entirely covering a top surface of a substrate according to an embodiment of the disclosure. FIG. 9B is a cross-sectional view taken along a sectional line A-A in FIG. 9A. FIG. 9C is cross-sectional view taken along a sectional line B-B in FIG. 9A. With reference to FIG. 9A, FIG. 9B, and FIG. 9C, the patterned heat dissipation structure 4*c* may entirely cover the top surface 21*a* of the substrate 21, thus providing an improved heat dissipation effect as compared to the effects achieved by the patterned heat dissipation structures 4 provided in the previous embodiments.

Specifically, the circuit substrate 2 provided in this embodiment includes a substrate 21 and a circuit 22, where the substrate 21 has a top surface 21*a*, and the circuit 22 has a plurality of signal contacts 221, and the signal contacts 221 are distributed on the top surface 21*a*. The electronic devices 3 are disposed on the circuit substrate 2, and each of the electronic devices 3 has a device pin 31 electrically connected to the signal contact 221.

In the present embodiment, a heat conductive coefficient of the patterned heat dissipation structure 4*c* is ≥6 W/mK, and the patterned heat dissipation structure entirely covers the top surface 21*a* of the substrate 21. A heat conductive coefficient of the first cover layer 6 is less than a heat conductive coefficient of the substrate 21, and the heat conductive coefficient of the patterned heat dissipation structure 4*c* is greater than the heat conductive coefficient of the substrate 21. Therefore, compared to the patterned heat dissipation structures 4 provided in the previous embodiments, the patterned heat dissipation structure 4*c* provided in this embodiment achieves an improved heat dissipation effect, and through the relationship of the heat conductive coefficients of the patterned heat dissipation structure 4*c*, the substrate 21, and the first cover layer 6, the molded electronic assembly as a whole may have the favorable heat dissipation performance.

Figure 9D:
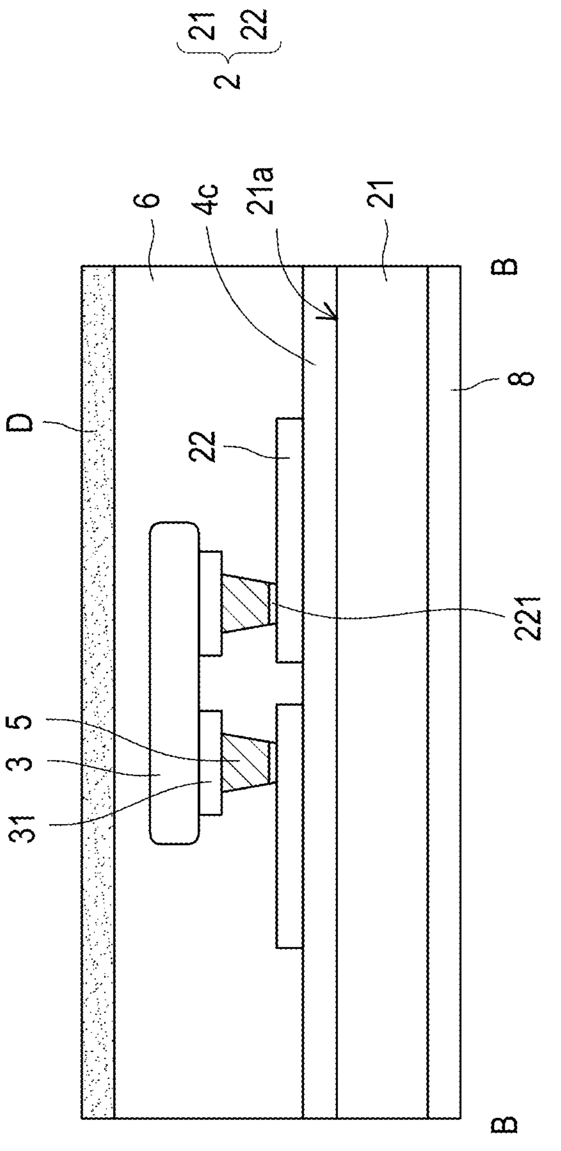
FIG. 9D illustrates a patterned heat dissipation structure according to another embodiment of the disclosure.

In the embodiment depicted in FIG. 9C, the patterned heat dissipation structure 4*c* is located above the circuit 22 and has a plurality of openings corresponding to the signal contacts 221, thus allowing the device pins 31 to be electrically connected to the signal contacts 221. FIG. 9D illustrates a patterned heat dissipation structure according to another embodiment of the disclosure. In the embodiment shown in FIG. 9D, the patterned heat dissipation structure 4*c* is located between the circuit 22 and the circuit substrate 2.

Besides, when the electronic devices 3 are photoelectric devices, such as LEDs, and when the patterned heat dissipation structure 4*c* is not transparent (i.e., when the patterned heat dissipation structure 4*c* is made of an opaque material), the patterned heat dissipation structure 4*c* has an opening O which is a first transparent region designed according to application requirements. The opening O allows the light emitted by the photoelectric devices to pass through the substrate 21 and illuminate in a downward manner according to reflection or diffusion mechanisms (e.g., a diffusion layer D). Specifically, the decorative layer 8 and the diffusion layer D are located on opposite sides of the circuit substrate 2, where the decorative layer 8 also has an opening O' (i.e., a second transparent region), and the size of the opening O' may be slightly smaller than the opening O of the patterned heat dissipation structure 4*c*.

In the present embodiment, a region where the opening O is orthogonally projected on the substrate 21 is overlapped with and greater than a region where the opening O' is orthogonally projected on the substrate 21, and the region where the opening O is orthogonally projected on the substrate 21 is not overlapped with a region where the electronic devices 3 are orthogonally projected on the substrate 21. As such, the light emitted by the photoelectric devices passes through the opening O, penetrates the substrate 21, and illuminates in a downward manner through the opening O', and the photoelectric devices pose no impact on the emission of light.

Figure 10B:
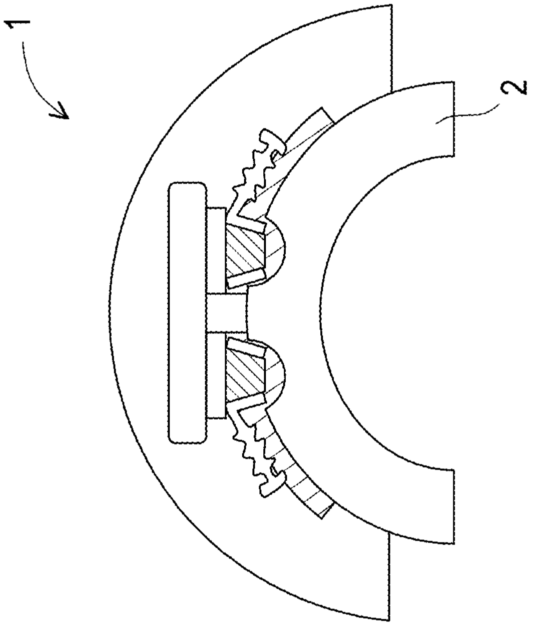
FIG. 10A and FIG. 10B are schematic views illustrating applications of a molded electronic assembly according to an embodiment of the disclosure.
Figure 10A:
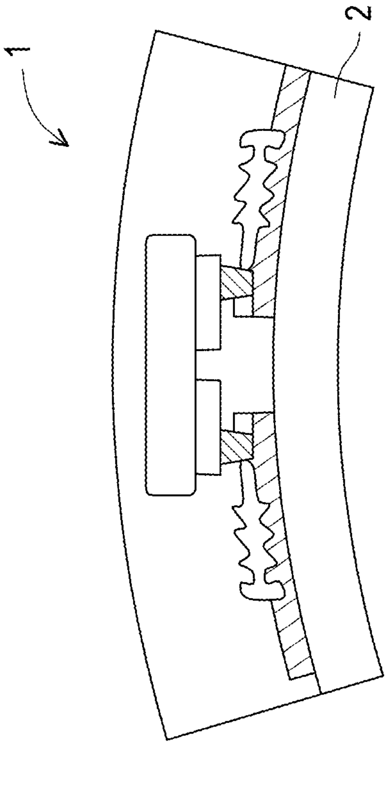

FIG. 10A and FIG. 10B are schematic views illustrating applications of a molded electronic assembly according to an embodiment of the disclosure. With reference to FIG. 10A and FIG. 10B, according to a molded electronic technology, a printed electronic technology and IMD may be integrated to combine circuits, touch controls, electronic devices, and other devices into one assembly. Therefore, the assembly may be manufactured in a three-dimensional manner on a curved substrate 2, thus saving assembly time and cost and enabling the overall product size to be reduced and compact. The molded electronic assembly 1 provided in this embodiment is the same as the molded electronic assembly 1 depicted in FIG. 2B and thus will not be further elaborated.

To sum up, in the molded electronic assembly provided in one or more embodiments of the disclosure, the collective design of the circuit and the patterned heat dissipation structures may achieve good heat dissipation effects. The patterned heat dissipation structures may dissipate heat from a plurality of directions, thus effectively preventing the reduction of the service life of the electronic devices due to temperature rise caused by heat generation, maintaining the operation of the electronic devices, and also extending the service life of the molded electronic assembly.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A molded electronic assembly, comprising:

a circuit substrate, comprising a substrate and a circuit, wherein the substrate has a top surface, the circuit has a plurality of signal contacts, and the signal contacts are distributed on the top surface;

a plurality of electronic devices, disposed on the circuit substrate, each of the electronic devices having a plurality of device pins connected to the signal contacts; and at least one patterned heat dissipation structure, having a longitudinal portion and a plurality of transverse portions branched from the longitudinal portion, the longitudinal portion extending from a signal contact of the signal contacts and extending toward any direction on the top surface of the substrate, wherein an extending direction of the transverse portions is different from an extending direction of the longitudinal portion.

2. The molded electronic assembly as claimed in claim 1, further comprising a first cover layer disposed on the substrate and covering the at least one patterned heat dissipation structure and at least parts of the electronic devices.

3. The molded electronic assembly as claimed in claim 2, wherein a height of the first cover layer is lower than or equal to a height of the electronic devices.

4. The molded electronic assembly as claimed in claim 2, further comprising a second cover layer, wherein the first cover layer is located between the second cover layer and the substrate, and the second cover layer covers the electronic devices.

5. The molded electronic assembly as claimed in claim 4, wherein a Young's coefficient of the second cover layer is greater than a Young's coefficient of the first cover layer, and a heat conductive coefficient of the second cover layer is less than a heat conductive coefficient of the first cover layer.

6. The molded electronic assembly as claimed in claim 1, further comprising a heat conductive material disposed on the substrate and surrounding the device pins.

7. The molded electronic assembly as claimed in claim 6, wherein the heat conductive material and the circuit are coplanar.

8. The molded electronic assembly as claimed in claim 6, wherein the heat conductive material covers at least one portion of the at least one patterned heat dissipation structure and covers at least one portion of the circuit.

9. The molded electronic assembly as claimed in claim 6, wherein the heat conductive material is located between the circuit and the top surface.

10. The molded electronic assembly as claimed in claim 1, wherein the substrate has a plurality of grooves recessed from the top surface, and the signal contacts are disposed in the grooves.

11. The molded electronic assembly as claimed in claim 1, wherein the at least one patterned heat dissipation structure has a heat input terminal and a plurality of heat output terminals, the heat input terminal contacts a corresponding device pin of the device pins or a corresponding signal contact of the signal contacts, and the heat output terminals extend toward different directions from the heat input terminal.

12. The molded electronic assembly as claimed in claim 1, wherein each of the device pins of the electronic devices is electrically connected to a corresponding signal contact of the signal contacts through a conductive glue.

13. The molded electronic assembly as claimed in claim 12, wherein the at least one patterned heat dissipation structure surrounds the corresponding conductive glue.

14. The molded electronic assembly as claimed in claim 12, wherein the at least one patterned heat dissipation structure further extends to and surrounds a side of a corresponding device pin of the device pins.

15. The molded electronic assembly as claimed in claim 1, wherein a heat conductive coefficient of the at least one patterned heat dissipation structure is ≥6 W/mK.

16. The molded electronic assembly as claimed in claim 1, wherein the number of the at least one patterned heat dissipation structure is plural, and each of the patterned heat dissipation structures starts from the corresponding signal contact and extends toward a plurality of directions on the top surface of the substrate.

17. A molded electronic assembly, comprising:

a circuit substrate, comprising a substrate and a circuit, wherein the substrate has a top surface, the circuit has a plurality of signal contacts, and the signal contacts are distributed on the top surface;

a plurality of electronic devices, disposed on the circuit substrate, each of the electronic devices having a plurality of device pins connected to the signal contacts;

a patterned heat dissipation structure, having a heat conductive coefficient ≥6 W/mK and having a first transparent region; and a decorative layer, located on one side of the circuit substrate and having a second transparent region, wherein a region where the first transparent region is orthogonally projected on the substrate is overlapped with and greater than a region where the second transparent region is orthogonally projected on the substrate, and the region where the first transparent region is orthogonally projected on the substrate is not overlapped with a region where the electronic devices are orthogonally projected on the substrate.

18. The molded electronic assembly as claimed in claim 17, wherein the patterned heat dissipation structure is located between the circuit and the substrate.

19. The molded electronic assembly as claimed in claim 17, wherein the patterned heat dissipation structure is located above the circuit and has a plurality of openings corresponding to the signal contacts, so as to enable the device pins to be electrically connected to the signal contacts.

20. The molded electronic assembly as claimed in claim 17, further comprising a first cover layer disposed on the substrate and covering the patterned heat dissipation structure and at least parts of the electronic devices, wherein a heat conductive coefficient of the first cover layer is less than a heat conductive coefficient of the substrate, and a heat conductive coefficient of the patterned heat dissipation structure is greater than the heat conductive coefficient of the substrate.

* * * * *